(12) United States Patent
Nakamura et al.

(10) Patent No.: US 7,042,016 B2
(45) Date of Patent: May 9, 2006

(54) SEMICONDUCTOR OPTICAL DEVICE, METHOD OF FORMING CONTACT IN SEMICONDUCTOR OPTICAL DEVICE

(75) Inventors: Takao Nakamura, Osaka (JP); Hiroki Mori, Osaka (JP); Koji Katayama, Osaka (JP)

(73) Assignee: Sumitomo Electric Industries, Ltd.

( * ) Notice: Subject to any disclaimer, the term of this patent is extended or adjusted under 35 U.S.C. 154(b) by 0 days.

(21) Appl. No.: 10/808,158

(22) Filed: Mar. 23, 2004

(65) Prior Publication Data
US 2005/0087869 A1    Apr. 28, 2005

(30) Foreign Application Priority Data
Oct. 22, 2003    (JP) .......................... P2003-362171

(51) Int. Cl.
*H01L 27/15*    (2006.01)
(52) U.S. Cl. ................ 257/81; 257/94; 257/99; 257/102; 257/103
(58) Field of Classification Search ........... 257/79–103
See application file for complete search history.

(56) References Cited

U.S. PATENT DOCUMENTS

| | | | |
|---|---|---|---|
| 5,396,103 A | 3/1995 | Oiu et al. | |
| 5,548,137 A | 8/1996 | Fan et al. | |
| 6,576,933 B1 * | 6/2003 | Sugawara et al. | |

FOREIGN PATENT DOCUMENTS

| | | |
|---|---|---|
| JP | 06-005920 | 1/1994 |
| JP | 06-310815 | 11/1994 |

OTHER PUBLICATIONS

Takao Nakamura et al., Optronics (2000) No. 12, pp. 126-131 (partial translation).
Y. Fan et al., "Graded band gap ohmic contact to p-ZnSe", Appl. Phys. Lett., 61 (26), Dec. 28, 1992, pp. 3160-3162.

* cited by examiner

*Primary Examiner*—Wai-Sing Louie
(74) *Attorney, Agent, or Firm*—Fish & Richardson P.C.

(57) ABSTRACT

A semiconductor optical device comprises a superlattice contact semiconductor region and a metal electrode. The superlattice contact semiconductor region has a superlattice structure. The superlattice contact semiconductor region includes a II–VI compound semiconductor region and a II–VI compound semiconductor layer. The II–VI compound semiconductor region contains zinc, selenium and tellurium, and the II–VI compound semiconductor layer contains zinc and selenium. The metal electrode is provided on said superlattice contact semiconductor region and the metal electrode is electrically bonded to the first II–VI compound semiconductor layer.

14 Claims, 13 Drawing Sheets

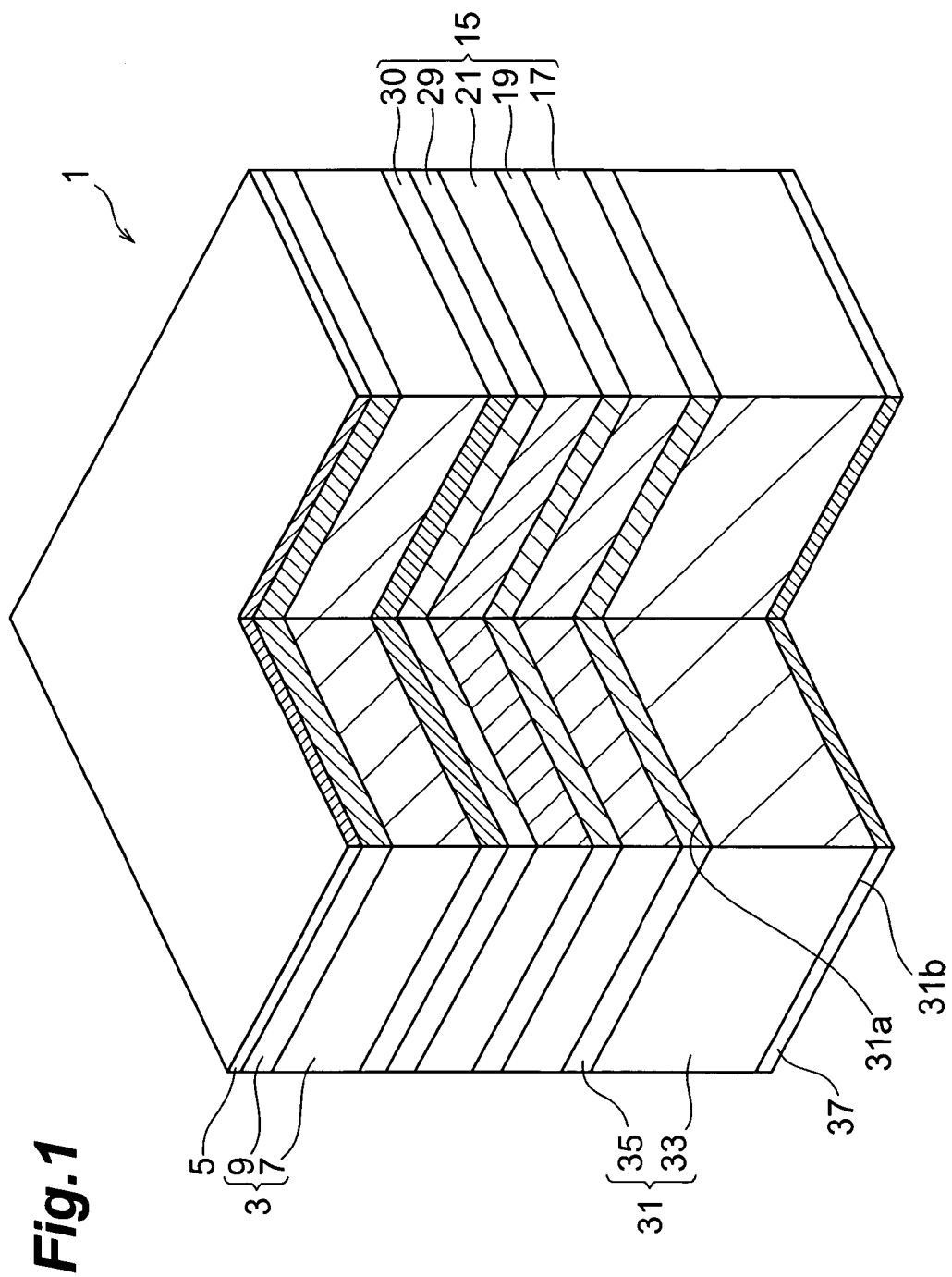

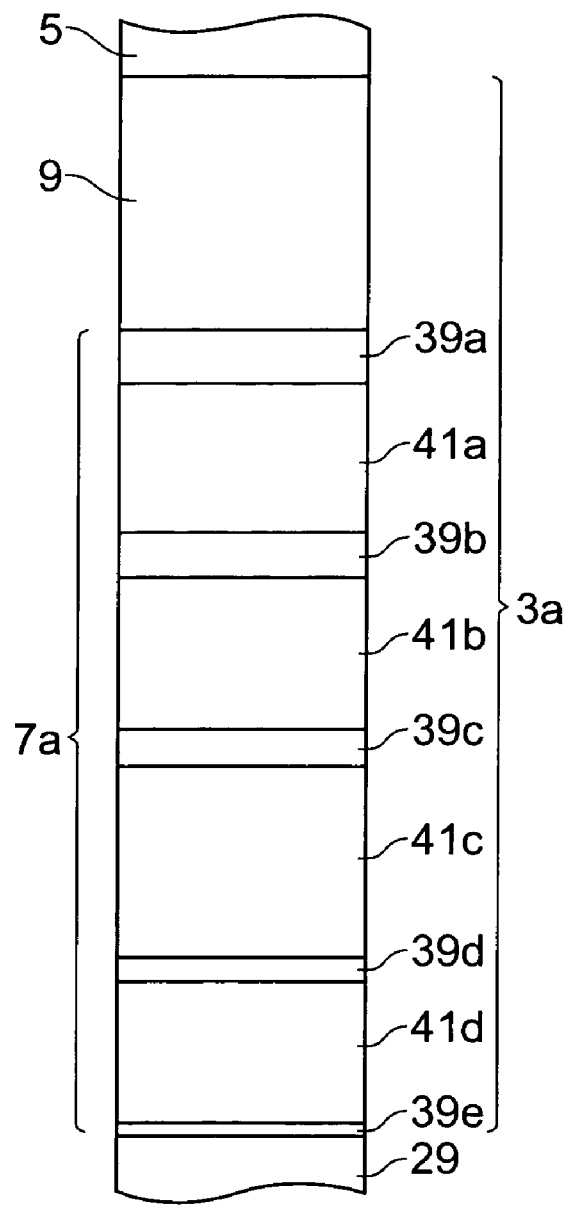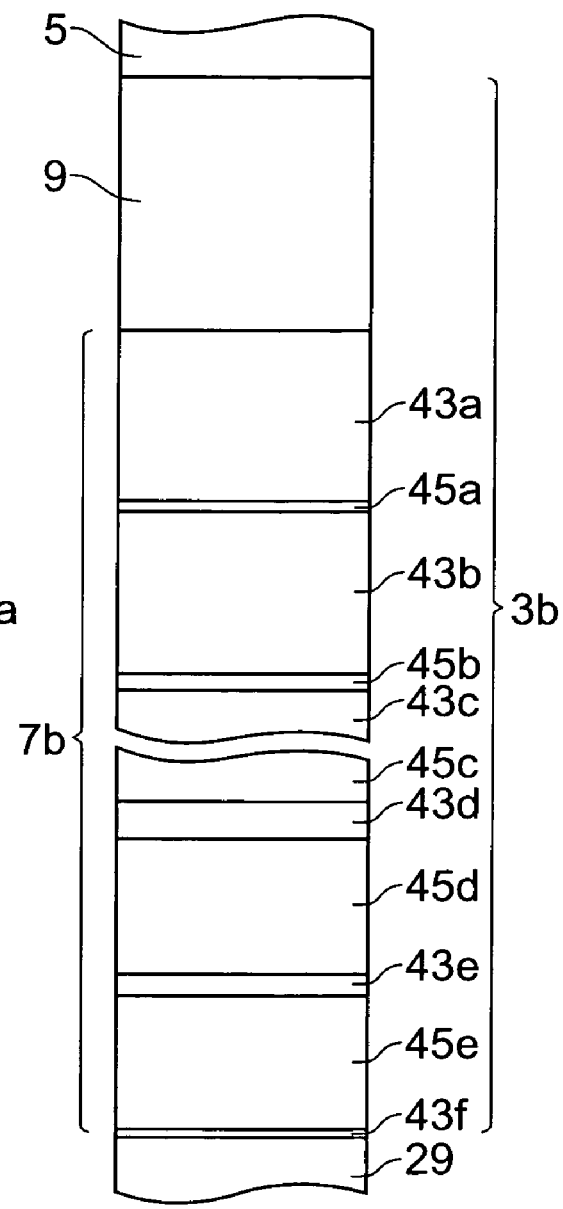

SEMICONDUCTOR OPTICAL DEVICE, METHOD OF FORMING CONTACT IN SEMICONDUCTOR OPTICAL DEVICE

BACKGROUND OF THE INVENTION

1. Field of the Invention

The present invention relates to a semiconductor optical device, and a method of forming a contact in a semiconductor optical device.

2. Related Background of the Invention

Publication 1 (Japanese Patent Application Laid Open No. 06-5920) discloses a light emitting diode. This light emitting diode has a ZnTe layer provided on a ZnTe/ZeSe multiple quantum well (MQW) structure, and a gold (Au) electrode bonded to the ZnTe layer.

Publication 2 (Japanese Patent Application Laid Open No. 06-310815) discloses a semiconductor laser diode. This semiconductor laser diode includes a p-type ZnTe/ZnSe multiple quantum well (MQW) structure, and semiconductor layers in the MQW structure are depleted. The semiconductor laser diode has an electrode bonded to the ZnTe layer.

SUMMARY OF THE INVENTION

Each of the above light emitting diode and semiconductor laser diode has a junction between the anode electrode and ZnTe layer.

According to experiments performed by the inventors, a light generating semiconductor device of a surface emitting type, such as a light emitting diode which has an anode electrode bonded to a ZnTe layer, exhibits a nonuniform intensity distribution in light emission on the light emitting surface thereof. Studies by the inventors have found that the nonuniform intensity distribution is caused by increase in the forward voltage at part of the junction between the anode electrode and the ZnTe semiconductor layer.

It is an object of the present invention to provide a semiconductor optical device which can reduce the nonuniformity of current distribution, and a method of forming a contact region in a semiconductor optical device which can reduce the nonuniformity of current distribution.

According to one aspect of the present invention, a semiconductor optical device comprises a superlattice contact semiconductor region and a metal electrode. The superlattice contact semiconductor region has a superlattice structure. The superlattice contact semiconductor region includes a II–VI compound semiconductor region and a first II–VI compound semiconductor layer. The II–VI compound semiconductor region contains zinc, selenium and tellurium. The first II–VI compound semiconductor layer contains zinc and selenium. The metal electrode is provided on the superlattice contact semiconductor region. The metal electrode is electrically connected to the first II–VI compound semiconductor layer.

In the semiconductor optical device, the II–VI compound semiconductor region includes a second II–VI compound semiconductor layer containing zinc and selenium and a third II–VI compound semiconductor layer containing zinc and tellurium.

In the semiconductor optical device, the II–VI compound semiconductor region includes a plurality of second II–VI compound semiconductor layers and a plurality of third II–VI compound semiconductor layers. Each second II–VI compound semiconductor layer contains zinc and selenium. Each third II–VI compound semiconductor layer contains zinc and tellurium. One of the second II–VI compound semiconductor layers is nearest to the first II–VI compound semiconductor layer. One of the third II–VI compound semiconductor layer is nearest to the first II–VI compound semiconductor layer. The nearest third II–VI compound semiconductor layer is provided between the first II–VI compound semiconductor layer and the nearest second II–VI compound semiconductor layers. The thickness of the first II–VI compound semiconductor layer is greater than the nearest second II–VI compound semiconductor layer.

In the semiconductor optical device, the II–VI compound semiconductor region includes a plurality of second II–VI compound semiconductor layers and a plurality of third II–VI compound semiconductor layers. Each second II–VI compound semiconductor layer contains zinc and selenium. Each third II–VI compound semiconductor layer contains zinc and tellurium. The total thickness of the second II–VI compound semiconductor layers is greater than the total thickness of the third II–VI compound semiconductor layers.

In the semiconductor optical device, the thickness of the metal electrode is equal to or larger than 10 nanometers. The thickness of the metal electrode is equal to or less than 30 nanometers.

In the semiconductor optical device, the thickness of the first II–VI compound semiconductor layer is equal to or larger than 2 nanometers.

The semiconductor optical device further comprises an active layer of a II–VI compound semiconductor provided on a supporting body. The supporting body includes a ZnSe substrate. The active layer is provided between the ZnSe substrate and the superlattice contact semiconductor region.

Another aspect according to the present invention is a method of forming a contact region for a II–VI compound semiconductor optical device. The method comprises the steps of: forming a II–VI compound semiconductor region on a supporting body, the II–VI compound semiconductor region containing zinc, selenium and tellurium; forming, on the II–VI compound semiconductor region, a first II–VI compound semiconductor layer containing zinc and selenium; and forming a metal electrode on the first II–VI compound semiconductor layer.

In the method, forming a II–VI compound semiconductor region on a supporting body includes the steps of: forming a second II–VI compound semiconductor layer on the supporting body using a molecular beam epitaxy method, the second II–VI compound semiconductor layer containing zinc and selenium; and forming a third II–VI compound semiconductor layer on the second II–VI compound semiconductor layer using a molecular beam epitaxy method, the second II–VI compound semiconductor layer containing zinc and tellurium. The ratio ($F_{VI}/F_{II}$) of a VI group element flux to a II group element flux is equal to or greater than three in the step of forming a second II–VI compound semiconductor layer on the supporting body. The ratio ($F_{VI}/F_{II}$) of a VI group element flux to a II group element flux is equal to or greater than three in the step of forming a third II–VI compound semiconductor layer on the second II–VI compound semiconductor layer.

In the method, forming a II–VI compound semiconductor region on a supporting body includes the steps of: forming a second II–VI compound semiconductor layer on the supporting body at a first temperature, the second II–VI compound semiconductor layer containing zinc and selenium, and the first temperature being equal to or less than 250 degrees Celsius; and forming a third II–VI compound semiconductor layer on the second II–VI compound semiconductor layer at a second temperature, the third II–VI compound semiconductor layer containing zinc and tellurium, and the second temperature being equal to or less than 250 degrees Celsius.

A still another aspect according to the present invention is a method of forming a II–VI compound semiconductor optical device. The method comprises the steps of: forming an active layer on a supporting body, said active layer being made of II–VI compound semiconductor; after forming an active layer, forming a II–VI compound semiconductor region on said supporting body, said II–VI compound semiconductor region containing zinc, selenium and tellurium; forming, on said II–VI compound semiconductor region, a first II–VI compound semiconductor layer containing zinc and selenium; and forming a metal electrode on said first II–VI compound semiconductor layer.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIG. 1 is a partial cross sectional view showing an semiconductor light generating device according to the present invention;

FIG. 3A is a view showing a quantum well structure of the II–VI compound semiconductor region including five ZnTe layers;

FIG. 3B is a view showing a quantum well structure of the II–VI compound semiconductor region including sixteen ZnTe layers.

DESCRIPTION OF THE PREFERRED EMBODIMENTS

Figure 2A:
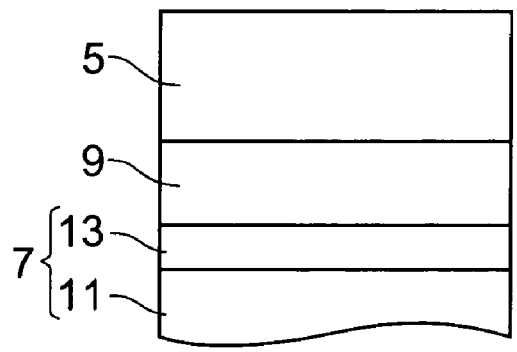
FIG. 2A is a view showing a contact structure in the semiconductor light generating device.

The teachings of the present invention will readily be understood in view of the following detailed descriptions with reference to the accompanying drawings illustrated by way of examples. Referring to the accompanying drawings, embodiments of a semiconductor optical device and a method of forming a contact in a semiconductor optical device according to the present invention will now be explained. When possible, parts identical to each other will be referred to with symbols identical to each other.

First Embodiment

FIG. 1 shows a semiconductor light generating device according to the first embodiment. A light generating device 1, such as a light emitting device, includes a contact semiconductor region 3 having a superlattice structure, and a metal electrode 5. The superlattice contact semiconductor region 3 is made II–VI compound semiconductor containing zinc (Zn), selenium (Se) and tellurium (Te) as constituents. The superlattice contact semiconductor region 3 has a quantum well structure. In one example, the superlattice contact semiconductor region 3 includes a II–VI compound semiconductor region 7 of a quantum well structure and a first II–VI compound semiconductor layer 9. The first II–VI compound semiconductor layer 9 is provided between the II–VI compound semiconductor region 7 and the metal electrode 5. The metal electrode 5 is provided on the II–VI compound semiconductor region 7. The metal electrode 5 is electrically connected to the first II–VI compound semiconductor region 9. In a preferred embodiment, the first II–VI compound semiconductor layer 9 may be a ZnSe semiconductor layer bonded to the metal electrode 5.

The first II–VI compound semiconductor layer 9 is provided between the metal electrode 5 and the II–VI compound semiconductor region 7 in the superlattice contact semiconductor region 3, and the first II–VI compound semiconductor layer 9 can prevent atoms in the metal electrode 5 from reacting with atoms in the first II–VI compound semiconductor layer 7. Thus, the first II–VI semiconductor compound layer 9 can improve the uniformity in electrical contact between the first II–VI compound semiconductor layer 9 and the metal electrode 5. Accordingly, the semiconductor light generating device has a contact structure reducing nonuniformity of current distribution.

FIG. 2A is a view showing semiconductor layers in the light generating device. In the light generating device 1, the II–VI compound semiconductor region 7 includes a second layer 11 of II–IV compound semiconductor containing zinc (Zn) and tellurium (Te) and a third layer 13 of II–IV compound semiconductor containing zinc (Zn) and selenium (Se). The third layer 13 of II–IV compound semiconductor is provided between the first layer 9 of II–IV compound semiconductor and the second layer 11 of II–IV compound semiconductor. In a preferred embodiment, the second compound II–VI compound semiconductor layer 11 may be made of p-type ZnSe semiconductor layer and the third II–VI compound semiconductor layer 13 may be made of p-type ZnTe semiconductor layer.

The first layer 9 of II–IV compound semiconductor layer prevents atoms in the metal layer 5 and the third compound semiconductor layer 13 to react with each other.

Figure 2B:
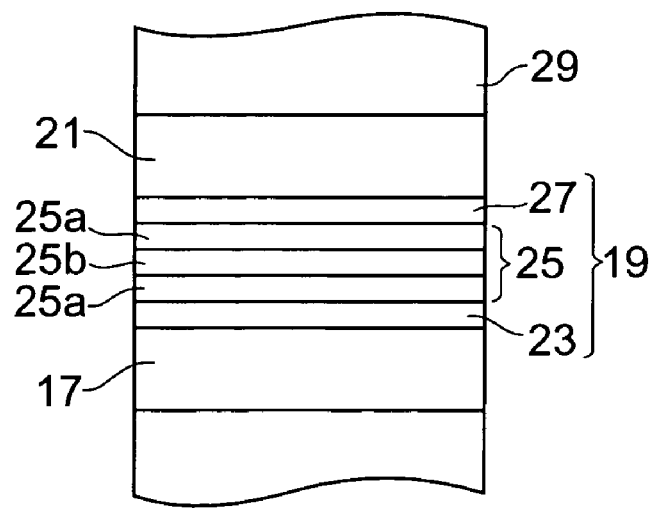
FIG. 2B is a view showing a semiconductor region which generates light.

Referring to FIGS. 1 and 2B, the semiconductor light generating device 1 has a device semiconductor region 15. The device semiconductor region 15 includes a fourth layer 17 of II–VI compound semiconductor, an active layer 19 of II–VI compound semiconductor, and a fifth layer 21 of II–VI compound semiconductor. The superlattice contact semiconductor region 3 is provided on the device semiconductor region 15. As shown in FIG. 2B, these layers 17, 19 and 21 are arranged in the device semiconductor region 15 as follows: the II–VI compound semiconductor active layer 19 is provided on the fourth II–VI compound semiconductor layer 17; the fifth II–VI compound semiconductor layer 21 is provided on the II–VI compound semiconductor active layer 19; and the sixth II–VI compound semiconductor layer 29 is provided on the fifth II–VI compound semiconductor layer 21. In a preferred embodiment, a heavily-doped II–VI compound semiconductor layer 30 is provided between the sixth II–VI compound semiconductor layer 29 and the superlattice contact semiconductor region 3.

The active layer 19 is provided between the fourth II–VI compound semiconductor compound layer 17 of and the fifth II–VI compound semiconductor layer. The fourth II–VI compound semiconductor layer 17 and the fifth II–VI compound semiconductor layer 21 act to confine carriers in the active layer 19. In a preferred embodiment, the active layer 19 is made of n-type ZnCdSe compound semiconductor, and the third II–VI compound semiconductor layer 21 is made of p-type ZnMgSSe compound semiconductor.

In one example, the active layer 19 has a first guide layer 23, a quantum structure layer 25 and a second guide layer 27. The quantum structure layer 25 is provided between the first guide layer 23 and the second guide layer 27. In a preferred embodiment, the first and second guide layers 23 and 27 are made of i-type ZnSe compound semiconductor. The quantum structure layer 25 has a SQW structure or a MQW structure, for example.

The quantum structure layer 25 may include a plurality of quantum well layers 25a and one or more barrier layers 25b. Each of the barrier layers 25b is provided between the quantum well layers 25a. In a preferred embodiment, the quantum layers 25a are made of i-type ZnCdSe compound semiconductor and the barrier layers 25b are made of i-type ZnSe compound semiconductor.

Referring to FIG. 1 again, the semiconductor light generating device 1 includes a supporting body 31. The device semiconductor region 15 is provided on one surface 31a of the supporting body 31. In a preferred embodiment, the supporting body 31 may have a ZeSe semiconductor substrate 33 and a ZnSe buffer layer provided on the supporting body 31. If required, an electrode 37 may be provided on the other surface 31b of the supporting body 31. In a preferred embodiment, the electrode 5 works as an anode and the electrode 37 works as a cathode. If a ZnSe semiconductor substrate is used as the supporting body 31, the ZnSe substrate can be optically activated by light incident from the active layer. The activated ZnSe substrate can emit light of a wavelength component different from that of the incident light.

A preferred example is as follows:
substrate 33:
   n-type ZnSe semiconductor substrate having a (100) surface;
buffer layer 35:
   n-type ZnSe semiconductor layer of 0.9 micrometer thickness;
II–VI compound semiconductor layer 17:
   n-type ZnMgSSe semiconductor layer of 0.5 micrometer thickness;
first guide layer 23:
   i-type ZnSe semiconductor layer of 0.03 micrometer thickness;
quantum structure layer 25:
   ZnCdSe/ZnSe multiple quantum well;
second guide layer 27:
   i-type ZnSe semiconductor layer of 0.03 micrometer thickness;
II–VI compound semiconductor layer 21:
   p-type ZnMgSSe semiconductor layer of 0.5 micrometer thickness;
II–VI compound semiconductor layer 29:
   p-type ZnSe semiconductor layer of 0.15 micrometer thickness;
II–VI compound semiconductor layer 30:
   $P^+$-type ZnSe semiconductor layer of 200 nanometer thickness;
quantum well II–VI compound semiconductor region 7:
   ZnSe/ZnTe quantum well structure of 40 nanometer thickness;
p-type layer 9 of a first II–VI compound semiconductor:
   ZeSe semiconductor layer of 3 nanometer thickness;
metal electrode 5: Au layer; and
metal electrode 37: indium layer.

In this example, the buffer layer is homo-epitaxitially grown on the ZnSe semiconductor substrate and a semiconductor layer(s) formed on the ZnSe semiconductor substrate is lattice-matched to ZnSe semiconductor. The crystal quality of a II–VI compound semiconductor layer grown on the ZnSe semiconductor substrate is superior to that of a substrate different from the ZnSe semiconductor substrate.

FIGS. 3A and 3B are views each showing the structure of the superlattice contact semiconductor region. Referring to 3A, a superlattice contact semiconductor region 3a is shown. The superlattice contact region 3a includes a II–VI compound semiconductor region 7a and the first II–VI compound semiconductor layer 9. The II–VI compound semiconductor region 7a includes the well layers 39a, 39b, 39c, 39d and 39e and the barrier layers 41a, 41b, 41c and 41d arranged to form the quantum well structure. In a preferred embodiment, the well layers 39a to 39e may be made of ZnTe semiconductor and the barrier layers 41a to 41d are made of ZnTe semiconductor.

For example, a II–VI compound semiconductor region of a quantum structure includes five ZnTe semiconductor layers, which are shown below:
first II–VI compound semiconductor layer 9: 3 nanometers;
ZnTe semiconductor layer 39a: 0.6 nanometers, doped with nitrogen (N);
ZnSe semiconductor layer 41a: 1.8 nanometers, doped with nitrogen (N);
ZnTe semiconductor layer 39b: 0.5 nanometers, doped with nitrogen (N);
ZnSe semiconductor layer 41b: 1.8 nanometers, doped with nitrogen (N);
ZnTe semiconductor layer 39c: 0.37 nanometers, doped with nitrogen (N);
ZnSe semiconductor layer 41c: 1.8 nanometers, doped with nitrogen (N);
ZnTe semiconductor layer 39d: 0.25 nanometers, doped with nitrogen (N);
ZnSe semiconductor layer 41d: 1.8 nanometers, doped with nitrogen (N); and
ZnTe semiconductor layer 39e: 0.12 nanometers, doped with nitrogen (N).

Referring to FIG. 3B, another superlattice contact region 3b is shown. The superlattice contact region 3b includes a II–VI compound semiconductor region 7b and the first II–VI compound semiconductor layer 9. The II–VI compound semiconductor region 7b has well layers 43a, 43b, 43c, 43d, 43e and 43f and barrier layers 45a, 45b, 45c, 45d and 45e arranged to form the quantum well structure. In a preferred embodiment, the well layers 43a to 49f are made of ZnTe semiconductor and the barrier layers 45a to 45e are made of ZnSe semiconductor.

For example, a II–VI compound semiconductor region is a quantum structure includes 16 ZnTe semiconductor layers. Some layers in the quantum structure of are shown below:
first II–VI compound semiconductor layer 9: 3 nanometers;
ZnTe semiconductor layer 43a: 2.0 nanometers, doped with nitrogen (N);
ZnSe semiconductor layer 45a: 0.113 nanometers, doped with nitrogen (N);
ZnTe semiconductor layer 43b: 1.85 nanometers, doped with nitrogen (N);
ZnSe semiconductor layer 45b: 0.225 nanometers, doped with nitrogen (N);
ZnTe semiconductor layer 43c: 1.72 nanometers, doped with nitrogen (N);
ZnSe semiconductor layer 45c: 0.338 nanometers, doped with nitrogen (N);
ZnTe semiconductor layer 43d: 0.37 nanometers, doped with nitrogen (N);
ZnSe semiconductor layer 45d: 1.575 nanometers, doped with nitrogen (N);
ZnTe semiconductor layer 43e: 0.25 nanometers, doped with nitrogen (N);
ZnSe semiconductor layer 45e: 1.68 nanometers, doped with nitrogen (N); and
ZnTe semiconductor layer 43f: 0.12 nanometers, doped with nitrogen (N).

In the superlattice contact semiconductor region 3, the number of the ZnSe semiconductor layers is, for example, four or more, and the number of the ZnTe semiconductor layers is, for example, five or more. This arrangement in the superlattice contact semiconductor region 3 can decrease the contact resistance thereof.

In the superlattice contact semiconductor regions 3a and 3b of the above examples, the ZnTe layers 39a to 39e and the ZnSe layers 41a to 41d are arranged alternately along an axis extending from the supporting body 31 to the metal electrode 5. Between one ZnTe layer (in the present example, ZnTe layer 39e) of the ZnTe layers 39a to 39e and another ZnTe semiconductor layer thereof (in the present example, ZnTe layer 39d) nearest thereto, the corresponding ZnSe layer of the ZnSe layers 41a to 41d (in the present example, ZnSe layer 41d) is located. The former ZnTe semiconductor layer and the corresponding ZnSe semiconductor layer (in the present example, ZnTe layer 39e and ZnSe layer 41d) are combined with each other to provide a semiconductor region. In the similar manner, one of the remaining ZnTe layers 39a to 39d is combined with one of the remaining ZnSe layers 41a to 41c to provide another semiconductor region. Finally, each ZnSe layer is combined with the corresponding ZnTe layer to provide a semiconductor region. The average molar fraction of ZeTe for each semiconductor region is defined as the ratio of the ZnTe fraction to the sum of the ZeSe fraction and the ZeTe fraction in that semiconductor region: [ZnTe]/([ZeSe]+[ZnTe]). The average molar fractions defined as above increase along a axis extending from the supporting body 31 to the metal electrode 5. The maximum of the above average molar fractions is grater than an average molar fraction in the last semiconductor region constituted by the ZnSe semiconductor layer bonded to the metal electrode and the ZnSe layer that is nearest thereto, and the average molar fraction is defined as the ratio of ZnTe fraction to the sum of ZeSe fraction and ZnTe fraction in the relevant semiconductor region.

In a preferred embodiment, as shown in FIGS. 3A and 3B, the thickness of each of the second II–VI compound semiconductor layers 41a to 41d (45a to 45d) is equal to or smaller than that of the first semiconductor layer 9.

The first II–VI compound semiconductor layer 9 prevents atoms in the metal electrode 5 from reacting with atoms in the third II–VI compound semiconductor layer 39a (containing zinc and tellurium). In addition to this advantage, if each of the second II–VI compound semiconductor layers 41a to 41d is thinner than the first II–VI compound semiconductor layer, these layers 41a to 41d do not increase resistance in the quantum well contact semiconductor region.

In a preferred embodiment of the semiconductor light generating device 1, the total thickness of the third II–VI compound semiconductor layers 39a to 39e is smaller than that of the third II–VI compound semiconductor layers 41a to 41e, and thus the superlattice contact semiconductor region 3 can transmit almost all light from the active layer.

In a preferred embodiment, the thickness of the metal electrode 5 is equal to or more than 10 nanometers. Further, the thickness of the metal electrode 5 is equal to or less than 30 nanometers. This metal electrode of a thickness in this range permits light from the active layer to transmit the metal electrode 5.

Preferably, the thickness of the first II–VI compound semiconductor layer 9 is equal to or more than two nanometers. The first II–VI compound semiconductor layer 9 of a thickness in the above range can prevent atoms in the metal electrode 5 from reacting with those in the ZnTe semiconductor layer 39a. Further, the thickness of the first II–VI compound semiconductor layer 9 is equal to or less than 20 nanometers. If the semiconductor light generating device has the first II–VI compound semiconductor layer 9 of a thickness in the range, the resistance increment from the layer 9 is not great.

Figure 4A:
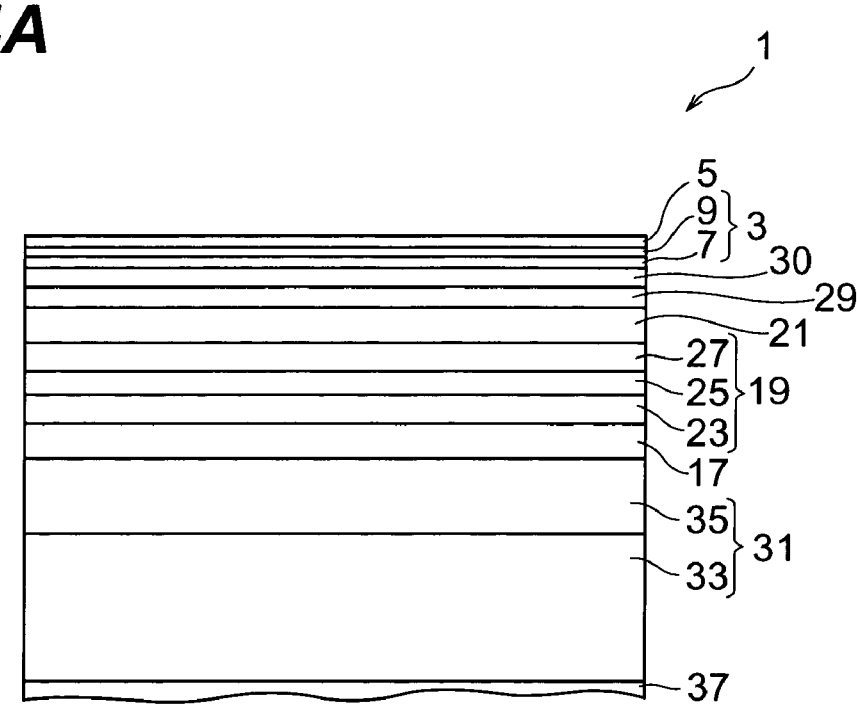
FIG. 4A is a view showing semiconductor layers in the semiconductor light generating device.

As shown in FIG. 4A, the semiconductor light generating device 1 according to the present embodiment includes the active layer of II–VI compound semiconductor provided on the supporting body 31. In a preferred example, the supporting body includes a substrate, such as ZnSe substrate. The active layer 19 is provided between the ZnSe substrate and the semiconductor region 3.

Figure 5:
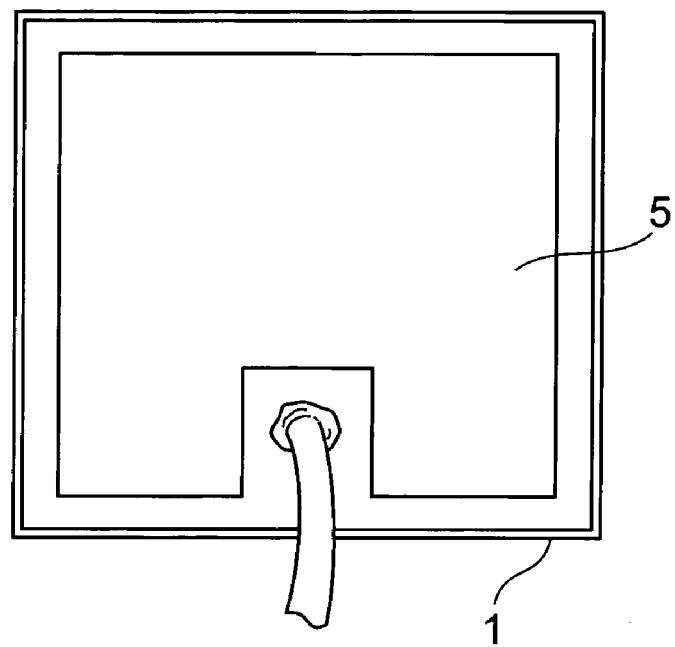
FIG. 5 is a top view showing a metal electrode in the semiconductor light generating device.

FIG. 5 is a top view showing a semiconductor light generating device. The metal electrode 5 is provided on the superlattice contact semiconductor region 3. If the semiconductor light generating device is a surface light emitting diode, then light generated by the semiconductor light generating device 1 emits through the metal electrode 5 that covers light emitting surface of the semiconductor light generating device 1.

The semiconductor layers of the superlattice contact semiconductor region 3 are not periodically arranged, and thus light associated with the semiconductor light generating device 1 passes through the superlattice contact semiconductor region 3 without interference therein.

Figure 4B:
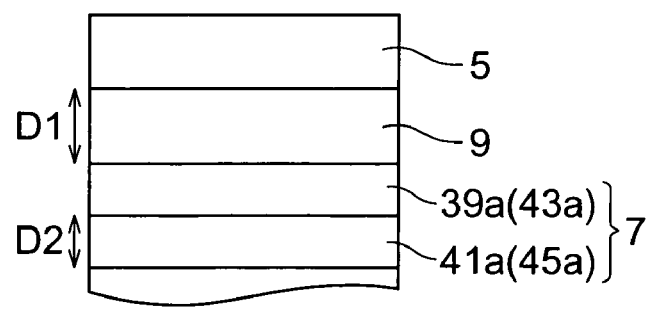
FIG. 4B is a view showing a contact region.

In a preferred embodiment of the semiconductor light generating device 1 as shown in FIG. 4B, the semiconductor layer 39a, nearest to the first II–VI compound semiconductor layer 9, of the third II–VI compound semiconductor layers 39a to 39e (each containing zinc and tellurium) is provided between the first II–VI compound semiconductor layer 9 and the semiconductor layer 41a, nearest to the first II–VI compound semiconductor layer 9, of the second II–VI compound semiconductor layers 41a to 41d (each containing zinc and selenium). The thickness D1 of the first II–VI compound semiconductor layer 9 is larger than the thickness D2 of the second II–VI compound semiconductor layer 41a. The average molar ratio in a semiconductor region constituted by the semiconductor layers 9 and 41a is defined as above and is greater than that of another semiconductor region constituted by the semiconductor layers 39a and 41a. Accordingly, the first II–VI compound semiconductor layer 9 can prevent atoms in the metal layer 5 from reacting with those in the first II–VI compound semiconductor layer 39a (containing zinc and tellurium as constituent elements). Further, if the ZnTe layers 41a to 41d are thinner than the first II–VI compound semiconductor layer 9, the resistance increase in the superlattice contact semiconductor region 3 is not great as a whole.

As described above, the semiconductor light generating device according to the present embodiment has the contact region that can reduce nonuniformity in the distribution of current flowing therethrough.

Figure 6A:
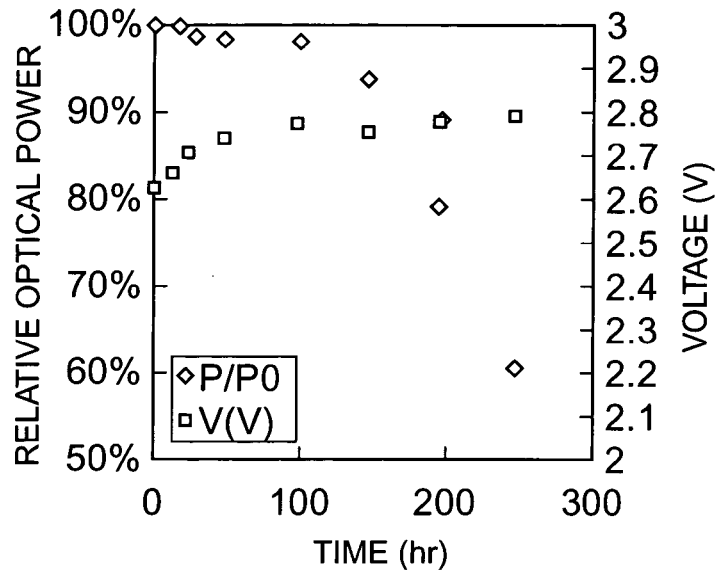
FIGS. 6A and 6B are graphs showing characteristics of II–VI compound semiconductor light generating devices.
Figure 6B:
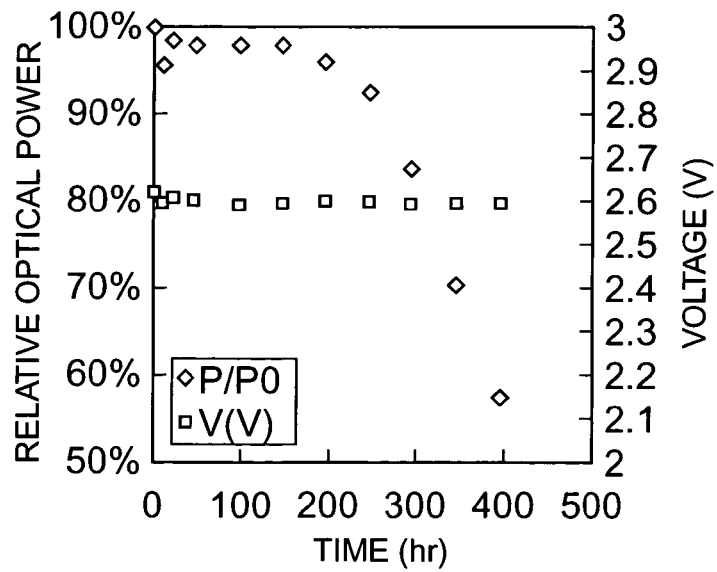

FIGS. 6A and 6B are graphs showing characteristics of II–VI compound semiconductor light emitting diode. In these graphs, the abscissa axis indicates the elapsed time, the left ordinate axis indicates the relative optical output power and the right ordinate axis indicates the forward biasing voltage. The relative optical output power is defined as a ratio (P/P0) of optical output power "P" at an elapsed time to the initial optical output power "P0". Current of 20 milliamperes (mA) is fed to light emitting diodes at 40 degrees Celsius in these experiments.

Experimental results of a II–VI compound semiconductor light generating device without the first II–VI compound semiconductor layer 9 (hereinafter referred to as "light emitting diode A") is shown in FIG. 6A. Experimental results of a II–VI compound semiconductor light generating device with the first II–VI compound semiconductor layer 9 (hereinafter referred to as light emitting diode B) is shown in FIG. 6B. The comparison of these experimental results reveals that the first II–VI compound semiconductor layer is effective in providing light emitting diodes with a long lifetime.

Figure 7:
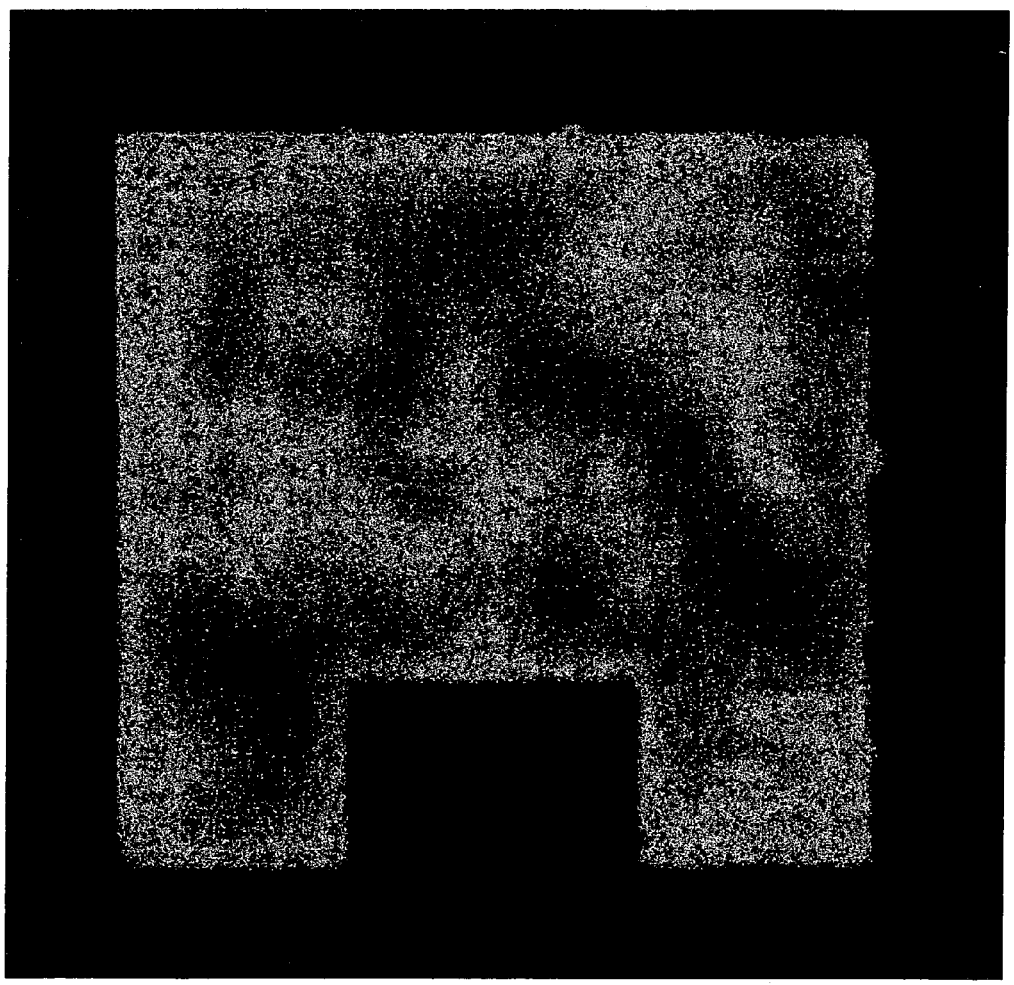
FIG. 7 is a view showing nonuniformity in light intensity in a II–VI compound semiconductor light generating device.

The light emitting diode B emits light uniformly even after current of 20 milliamperes has been fed thereto at 40 degrees Celsius for 100 hours. On the other side, the light emitting diode A does not uniformly emit light as shown in FIG. 7 after current of 20 milliamperes has been fed thereto at 40 degrees Celsius for 100 hours. Micro XPS is used in order to study the difference between a uniformly emitting area and a nonuniformly emitting area in the light emitting diode A.

The micro XPS results are shown as follows.

|  | uniformly emitting area | nonuniformly emitting area |
| --- | --- | --- |
| Carbon (C) | 51.1 | 57.9 |
| Oxygen (O) | 24.6 | 19.5 |
| Gold (Au) | 6.4 | 12.2 |
| Zinc (Zn) | 5.3 | 3.8 |
| Tellurium (Te) | 12.3 | 6.6 |

The above results show that the quantity of gold and the quantity of tellurium differ between the uniformly emitting area and the nonuniformly emitting area. The quantity of tellurium in the nonuniformly emitting area is approximate twice as much as that in the uniformly emitting area. This result shows that tellurium atoms diffuse into the metal electrode. The quantity of gold in the nonuniformly emitting area is approximate half as much as that in the uniformly emitting area. This result shows that gold atoms diffuse into the contact semiconductor region. The first II–VI compound semiconductor layer 9 is effective in avoiding the diffusion of gold and tellurium.

As described above, according to the present embodiment, the semiconductor light generating device having the contact region can reduce nonuniformity of distribution in current flowing therethrough.

Second Embodiment

Figure 8A:
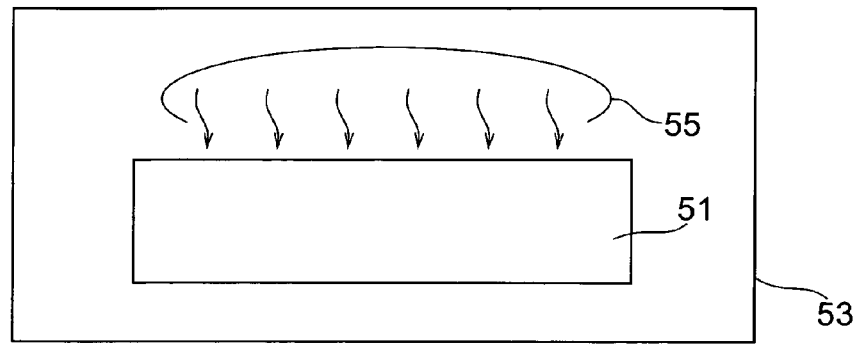
FIGS. 8A to 8C are views showing steps of forming a semiconductor light generating device.

Next, a method of manufacturing a II–VI compound semiconductor light generating device is explained. A substrate is prepared as shown in FIG. 8A. In the subsequent explanation, a method of manufacturing a II–VI compound semiconductor light generating device, such as a light emitting diode, by use of a ZnSe substrate will be described.

In one example of the method, a molecular beam epitaxy (MBE) apparatus is used as an epitaxial growth apparatus. An MBE apparatus has Knusen cells for zinc (Zn) source, magnesium (Mg) source, cadmium (Cd) source, tellurium (Te) source and zinc chloride ($ZnCl_2$) source, and valve cells for sulfur (S) source and selenium (Se) source in the chamber.

A ZnSe substrate 51 is placed in the MBE apparatus 53. The temperature of the ZnSe substrate 51 is increased for cleaning the ZnSe substrate 51. The cleaning temperature is, for example, 390 degrees Celsius. A cleaning gas, such as hydrogen gas ($H_2$), is supplied to the chamber to generate the plasma 55 thereof for a predetermined time, for example, 30 minutes. After a pyrometer indicates that the substrate temperature is kept at a predetermined temperature, the H shutter for the hydrogen gas and the main shutter in the MBE apparatus 53 are opened to start a cleaning step by use of hydrogen radicals 55.

An example of the cleaning condition is:
Flow of $H_2$ gas: 1.0 sccm
Power of RF gun: 450 watts.

If a RHEED display shows a clear c(2×2) pattern, the H shutter and the main shutter are closed and the RF gun is turned off. After the cleaning has been finished, the temperature of the ZnSe substrate is lowered to 325 degrees Celsius.

Figure 8B:
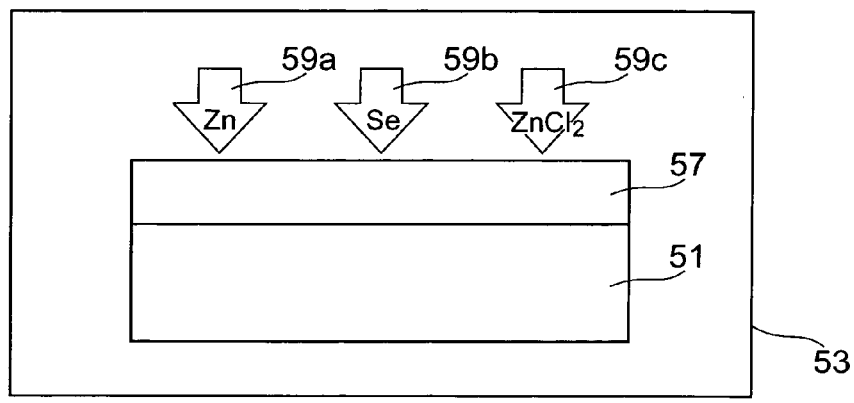

As shown in FIG. 8B, a buffer layer is formed on the ZnSe substrate 51. The cells (for Zn source, Se source and $ZnCl_2$ source) in the MBE apparatus 53 are opened to supply the Zn flux 59a, Se flux 59b and $ZnCl_2$ flux 59c to the ZnSe substrate 51 and the buffer layer 57 of n-type ZnSe semiconductor is grown epitaxially on the ZnSe substrate 51. The thickness of the buffer layer 57 is 60 nanometers, for example.

Figure 8C:
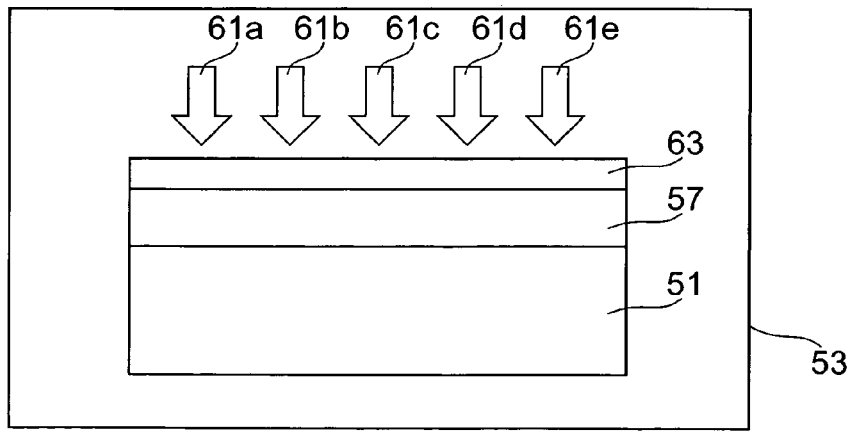

As shown in FIG. 8C, a cladding layer 63 is formed on the buffer layer 57. The cells (for Zn source, Mg source, S source, Se source and $ZnCl_2$ source) in the MBE apparatus 53 are opened to supply the Zn flux 61a, Mg flux 61b, S flux 61c, Se flux 61d and $ZnCl_2$ flux 61e onto the ZnSe substrate 51, and the cladding layer 63 of n-type ZnMgSSe semiconductor is grown epitaxially on the ZnSe layer 57. The thickness of the cladding layer 63 is 500 nanometers, for example.

Figure 9A:
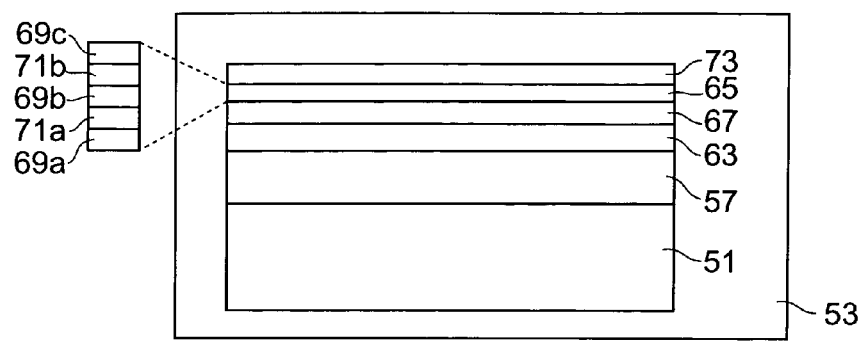
FIGS. 9A to 9C are views showing steps of forming a semiconductor light generating device.

As shown in FIG. 9A, an active layer is formed on the cladding layer 63. In this example, the active layer includes a guiding layer 67, a quantum structure layer 65 and a guide layer 73. The quantum structure layer 65 has a plurality of quantum well layers 69a, 69b, 69c and one or more barrier layers 71a and 71b.

The cells (for Zn source and Se source) are opened to supply Zn flux and Se flux onto the ZnSe substrate 51 and the guide layer 67 of i-type ZnSe semiconductor is epitaxially grown on the n-type ZnMgSSe layer 61. The thickness of the guide layer 67 is 40 nanometers, for example.

The cells (for Zn source, Cd source and Se source) are opened to supply Zn flux, Cd flux and Se flux onto the ZnSe substrate 51 and the well layer 69a of i-type ZnCdSe semiconductor is epitaxially grown on the guide layer 67. The thickness of the well layer 69a is three nanometers, for example.

Next, the cells (for Zn source and Se source) are opened to supply Zn flux and Se flux onto the ZnSe substrate 51 and the barrier layer 71a of i-type ZnSe semiconductor is epitaxially grown on the well layer 69a. The thickness of the barrier layer 71a is 10 nanometers, for example.

Further, the cells (for Zn source, Cd source and Se source) are opened to supply Zn flux, Cd flux and Se flux onto the ZnSe substrate 51, and the well layer 69b of i-type ZnCdSe semiconductor is epitaxially grown on the barrier layer 71a. The thickness of the well layer 69b is three nanometers, for example.

Thereafter, the growth of the well and barrier layers may be repeated predetermined times. Subsequently, the barrier layer 71b and the well layer 69c are formed in the present example.

After the last quantum well has been formed, the cells (Zn source, Se source) is opened to supply Zn flux and Se flux onto the ZnSe substrate 51. A guide layer 73 of i-type ZnSe semiconductor is epitaxially grown on the well layer 69c. The thickness of the guide layer 73 is 40 nanometers, for example.

Figure 9B:
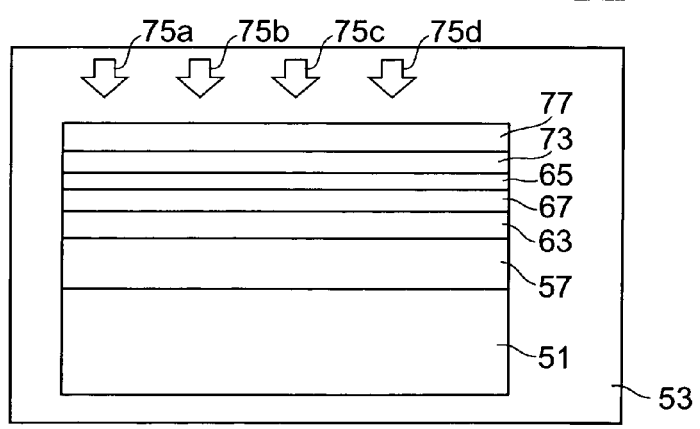

As shown in FIG. 9B, a cladding layer 77 is formed on the guide layer 73. In order to dope the cladding layer 77 with p-type dopant, nitrogen gas is supplied to the chamber and the plasma of the nitrogen gas is generated. The cells (Zn source, Mg source, S source, Se source) are opened to supply Zn flux 75a, Mg flux 75b, S flux 75c, and Se flux 75d onto the ZnSe substrate 51. The cladding layer 77 of p-type ZnSe semiconductor is formed on the guide layer 73. The thickness of the cladding layer 77 is 50 nanometers, for example.

After the cladding layer has been formed, all the shutters of the cells are closed. Then, the growth temperature is set at 250 degrees Celsius.

Figure 9C:
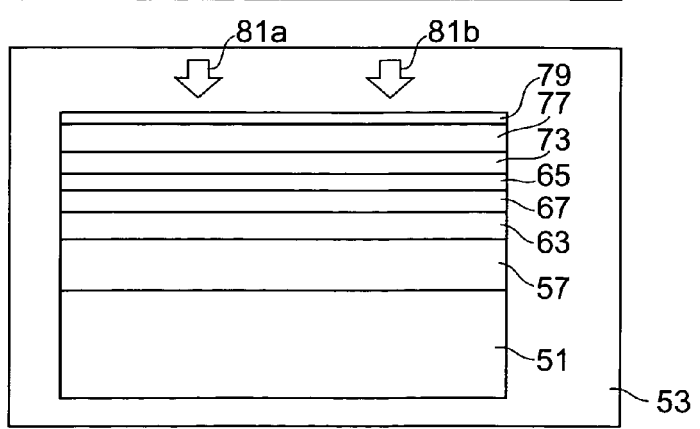

As shown in FIG. 9C, a p$^+$-type ZnSe layer 79 is formed on the cladding layer 77. In order to dope the cladding layer 79 with p-type dopant, nitrogen gas is introduced into the chamber and the plasma of the nitrogen gas is generated. The cells (Zn source, Se source) are opened to supply Zn flux 81a and Mg flux 81b onto the ZnSe substrate 51. The p$^+$-type ZnSe layer 79 is formed on the p-type cladding layer 77. The thickness of the p$^+$-type ZnSe layer 79 is 200 nanometers, for example. In a preferred example, the substrate temperature is 250 degrees Celsius and the RF power is 85 watts, for example.

Figure 10A:
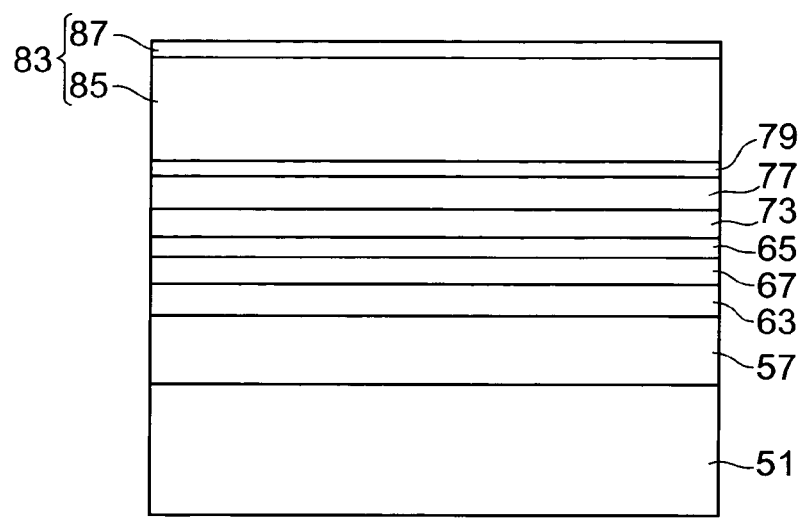
FIGS. 10A and 10B are views showing steps of forming a semiconductor light generating device.
Figure 10B:
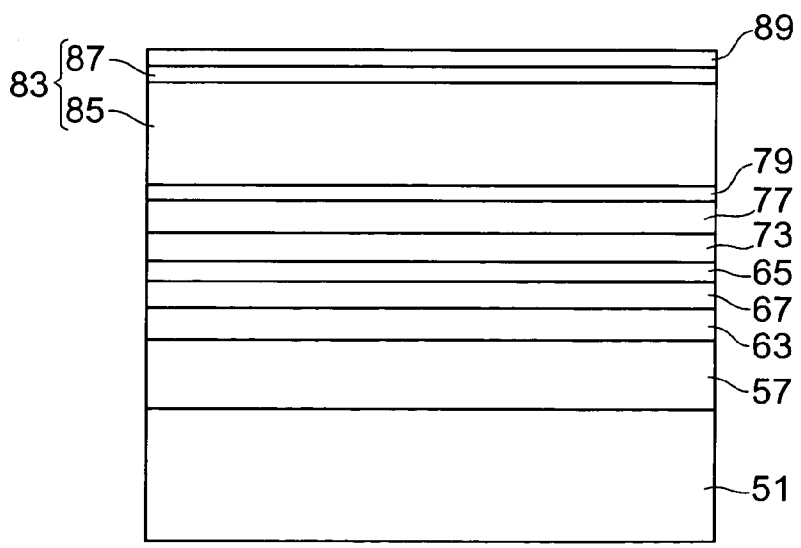

Subsequently, a method of forming a superlattice contact region 83 for the II–VI compound semiconductor light generating device will be explained. As shown in FIG. 10A, according to this method, a region 85 of II–VI compound semiconductor containing zinc, selenium and tellurium is formed on the device semiconductor region that has been formed in the above step. The II–VI compound semiconductor region 85 has a quantum well structure. A layer 87 of a first II–VI compound semiconductor containing zinc and selenium is formed on the II–VI compound semiconductor region 85. As shown in FIG. 10B, a metal electrode 89, such as gold electrode, is formed on the first II–VI compound semiconductor layer 87 in this manufacturing method.

Since the first II–VI compound semiconductor layer 87 is formed prior to forming the metal electrode 89, the first II–VI compound semiconductor layer 87 is provided between the metal layer 89 and the II–VI compound semiconductor region 85 in the quantum well structure contact region 83. Accordingly, atoms in the metal electrode 89 made of, for example, gold do not react with atoms in the II–VI compound semiconductor region 85 in the method.

Figure 11B:
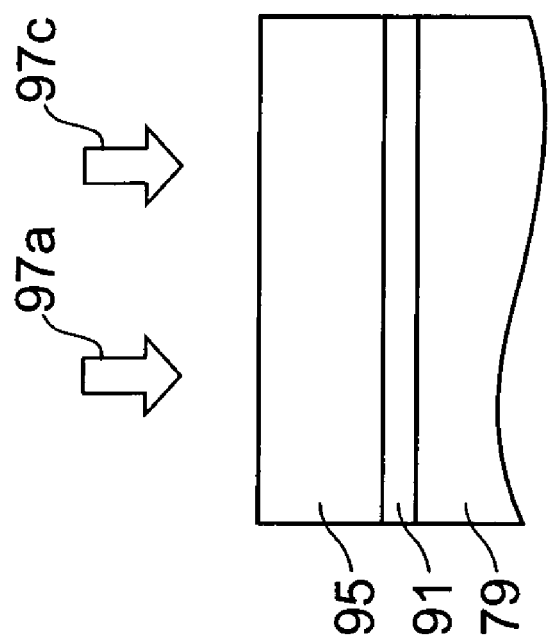
FIGS. 11A and 11B are views showing a method of forming a contact in a II–VI compound semiconductor optical device.
Figure 11A:
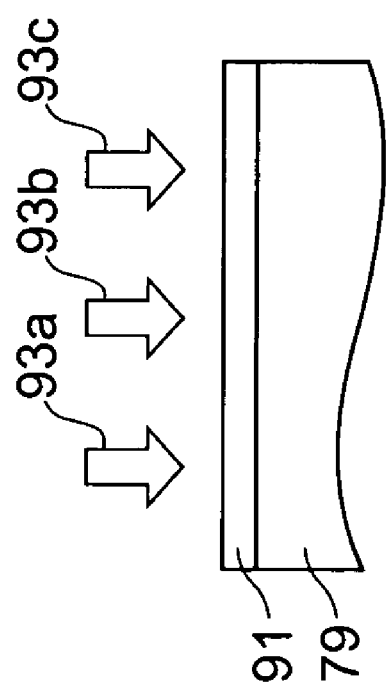

A step of forming the II–VI compound semiconductor region 85 will be described in detail. As shown in FIG. 11A, a layer 91 of a second II–VI compound semiconductor containing zinc and selenium is formed. The shutter for the Zn source, the Te source and the N source are opened to supply Zn flux 93a, Te flux 93b and N flux 93c onto the ZnSe substrate, and a second II–VI compound semiconductor layer 91 is epitaxially grown on the p$^+$-type ZnSe layer 79. In a preferred embodiment, the second II–VI compound semiconductor layer 91 may be a ZnTe layer doped with nitrogen. In one example, the substrate temperature is equal to or lower than 250 degrees Celsius and the RF power is about 100 watts. The shutters are opened for one second and the thickness of the second II–VI compound semiconductor layer 91 formed is 0.12 nanometers, for example.

Next, the shutter for the Te source is closed and the shutter for the Se source is opened. As shown in FIG. 11B, a third layer of a II–VI compound semiconductor containing zinc and selenium is formed. Zn flux 97a and Se flux are supplied onto the ZnSe substrate, and the third II–VI compound semiconductor layer 95 is epitaxially grown on the second II–VI compound semiconductor layer 91. In one example, the above cells are opened for 16 seconds. The thickness of the third II–VI compound semiconductor layer 95 formed is, for example, 1.8 nanometers. The substrate temperature is equal to or lower than 250 degrees Celsius and the RF power is 85 watts, for example. In a preferred example, the third II–VI compound semiconductor layer 95 may be an undoped ZnSe layer.

The RF power is changed to a power greater than 100 watts, such as 400 watts, and then the remaining semiconductor layers are sequentially formed as follows: The shutter for the Zn source, the Te source and the N source are opened for about three seconds; The shutters for the Zn source, the Se source, the N source are opened for about 16 seconds; The shutters for the Zn source, the Te source and the N source are opened for about four seconds; The shutters for the Zn source, the Se source, the N source are opened for about 16 seconds; The shutters for the Zn source, the Te source and the N source are opened for about five seconds.

After the above step, a II–VI compound semiconductor region 85 shown in FIG. 10A is formed on the ZnSe substrate 51. Then, the shutter for the Zn source and the Se source are opened for about 26 seconds to form a first II–VI compound semiconductor layer 87 on the II–VI compound semiconductor region 85. In a preferred example, the growth temperature may be equal to or greater than 235 degrees Celsius. In the growth in this temperature range, the deterioration of crystal quality does not occur. The growth temperature may be equal to or less than 250 degrees Celsius. The growth in this temperature range avoids diffusing the dopant.

The semiconductor light generating device, such as light emitting diode, has been formed according to this method. Since the first II–VI compound semiconductor layer 87 is formed prior to forming the metal electrode 89, the first II–VI compound semiconductor layer 87 is provided between the metal electrode 87 and the II–VI compound semiconductor region 85 in the quantum well contact semiconductor region 83, thereby preventing atoms in the metal electrode 89 and the II–VI compound semiconductor region 89 to react with each other. As described in this embodiment, a method of manufacturing a semiconductor light generating device provides a contact region which can reduce the nonuniformity in the distribution of current flowing therethrough.

Light emitting diodes are formed using the following recipes of flux ratios for the contact region: $F_{IV}/F_{II}$=2.5, 3.0, 3.5, 4.0 and 4.5, and are evaluated.

Figure 12:
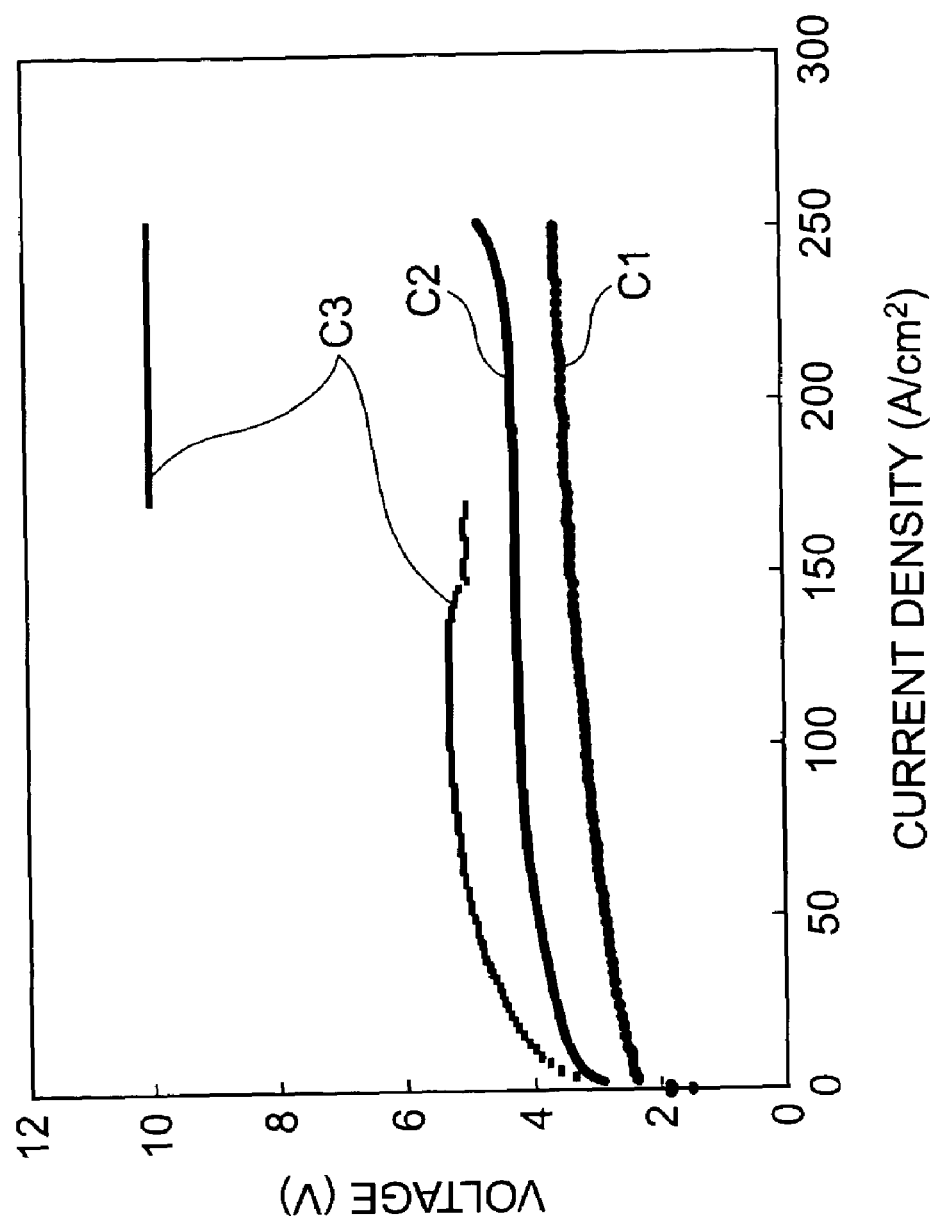
FIG. 12 is a graph showing characteristics of light emitting diodes formed by use of a number of flux recipes ($F_{II}/F_{VI}$)

Initial voltages across the light emitting diodes that are formed in the flux ratios $F_{IV}/F_{II}$=3.0, 3.5 and 4.0 are greater than those in the other flux ratios. FIG. 12 shows the characteristics of light emitting diodes made in a number of flux ratios. With reference to FIG. 12, curves C1, C2 and C3 indicate the contact characteristics of light emitting diodes, the semiconductor layers 87 of which are formed in the flux ratios $F_{IV}/F_{II}$=2.5, 3.5 and 4.5, respectively. In the light emitting diodes formed in flux ratios greater than $F_{IV}/F_{II}$=2.5, the initial contact voltage is lowered, and the preferred flux ratios are equal to or greater than $F_{IV}/F_{II}$=3.0. In the light emitting diodes formed in flux ratios greater than $F_{IV}/F_{II}$=4.5, the initial contact voltage is lowered, and the preferred flux ratios are equal to or less than $F_{IV}/F_{II}$=4.0.

Figure 13:
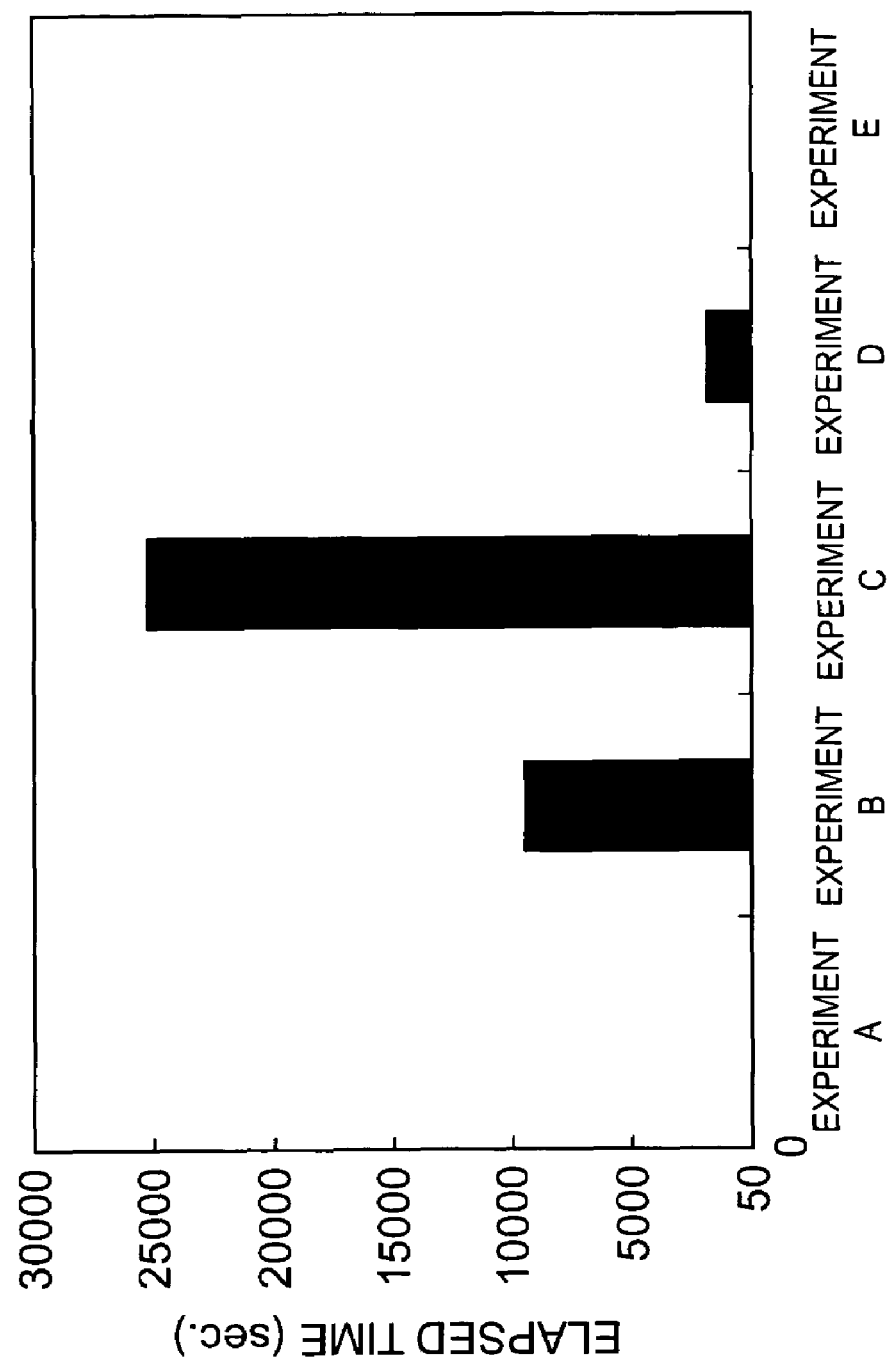
FIG. 13 is a graph showing characteristics of light emitting diodes formed by use of a number of flux recipes ($F_{II}/F_{VI}$)

FIG. 13 is a graph showing characteristics of light emitting diodes made by use of the flux ratios ($F_{IV}/F_{II}$) for the ZnSe layer 87. Experimental conditions A to E correspond to flux ratios 2.5, 3.0, 3.5, 4.0 and 4.5, respectively. The abscissa axis indicates the elapsed time of the period from the beginning to the time at which a voltage across the relevant light emitting diode exceeds five volts under 500 milliamperes per square centimeter ($mA/cm^2$). Elapsed times for light emitting diodes made by use of the flux ratios 3.0, 3.5 and 4.0 are greater than those in the other flux ratios. A light emitting diode made by use of a flux ratio greater than 2.5 exhibits a long elapsed time, and thus flux ratios greater than 3 are preferable. A light emitting diode made by use of a flux ratio equal to or less than 4.5 exhibits a long elapsed time, and thus flux ratios not greater than 4 are preferable. A light emitting diode made by use of a flux ratio in the above range exhibits a good contact characteristic.

In flux ratio 2.5, c(2×2) RHEED pattern appears. In flux ratio 3.0, the intensity of c(2×2) RHEED pattern is larger than that of 2×1 RHEED pattern. In flux ratio 3.5, both of these patterns appear, and the intensity of c(2×2) RHEED pattern is approximately equal to that of 2×1 RHEED pattern. In flux ratio 4.0, the intensity of 2×1 RHEED pattern is larger than that of c(2×2) RHEED pattern. In flux ratio 4.5, 2×1 RHEED pattern appears. In a preferred condition for forming the film, both of 2×1 RHEED pattern and c(2×2) RHEED pattern appear.

As described above, according to the present embodiment, the semiconductor light generating device has the contact region that can reduce nonuniformity in the distribution of current flowing therethrough.

Having described and illustrated the principle of the invention in a preferred embodiment thereof, it is appreciated by those having skill in the art that the invention can be modified in arrangement and detail without departing from such principles. The present invention is not limited to the specific embodiments in the specification. Details of structures of these devices can be modified as necessary. We therefore claim all modifications and variations coming within the spirit and scope of the following claims.

What is claimed is:

1. A semiconductor optical device comprising:
   a superlattice contact semiconductor region having a superlattice structure, said superlattice contact semiconductor region including a II–VI compound semiconductor region and a first II–VI compound semiconductor layer, said II–VI compound semiconductor region containing zinc, selenium and tellurium and said first II–VI compound semiconductor layer containing zinc and selenium; and
   a metal electrode provided on said superlattice contact semiconductor region, said metal electrode being electrically connected to said first II–VI compound semiconductor layer;
   wherein said II–VI compound semiconductor region includes a second II–VI compound semiconductor layer containing zinc and selenium and a third II–VI compound semiconductor layer containing zinc and tellurium, the first II–VI compound semiconductor layer is provided between the metal electrode and the third II–VI compound semiconductor layer to prevent atoms in the metal electrode from reacting with atoms in the II–VI compound semiconductor layer, and the third II–VI compound semiconductor layer is provided between the first II–VI compound semiconductor layer and the second II–VI compound semiconductor layer.

2. A semiconductor optical device comprising:
   a superlattice contact semiconductor region having a superlattice structure, said superlattice contact semiconductor region including a II–VI compound semiconductor region and a first II–VI compound semiconductor layer, said II–VI compound semiconductor region containing zinc, selenium and tellurium, and said first II–VI compound semiconductor layer containing zinc and selenium;
   a metal electrode provided on said superlattice contact semiconductor region, said metal electrode being electrically connected to said first II–VI compound semiconductor layer;
   wherein said II–VI compound semiconductor region includes a plurality of second II–VI compound semiconductor layers and a plurality of third II–VI compound semiconductor layers,
   wherein each second II–VI compound semiconductor layer contains zinc and selenium,
   wherein each third II–VI compound semiconductor layer contains zinc and tellurium,
   wherein one of said second II–VI compound semiconductor layers is nearest to said first II–VI compound semiconductor layer,
   wherein one of said third II–VI compound semiconductor layers is nearest to said first II–VI compound semiconductor layer,
   wherein said nearest third II–VI compound semiconductor layer is provided between said first II–VI compound semiconductor layer and said nearest second II–VI compound semiconductor layer, and
   wherein a thickness of said first II–VI compound semiconductor layer is greater than said nearest second II–VI compound semiconductor layer, the first II–VI compound semiconductor layer is provided between the metal electrode and the third II–VI compound semiconductor layer to prevent atoms in the metal electrode from reacting with atoms in the II–VI compound semiconductor layer, and the third II–VI compound semiconductor layer is provided between the first II–VI compound semiconductor layer and the second II–VI compound semiconductor layer.

3. A semiconductor optical device comprising:

a superlattice contact semiconductor region having a superlattice structure, said superlattice contact semiconductor region including a II–VI compound semiconductor region and a first II–VI compound semiconductor layer, said II–VI compound semiconductor region containing zinc, selenium and tellurium, and said first II–VI compound semiconductor layer containing zinc and selenium;

a metal electrode provided on said superlattice contact semiconductor region, said metal electrode being electrically connected to said first II–VI compound semiconductor layer;

wherein said II–VI compound semiconductor region includes a plurality of second II–VI compound semiconductor layers and a plurality of third II–VI compound semiconductor layers, wherein each second II–VI compound semiconductor layer contains zinc and selenium, wherein each third II–VI compound semiconductor layer contains zinc and tellurium, and wherein a total thickness of said second II–VI compound semiconductor layers is greater than a total thickness of said third II–VI compound semiconductor layers, the first II–VI compound semiconductor layer is provided between the metal electrode and the third II–VI compound semiconductor layer to prevent atoms in the metal electrode from reacting with atoms in the II–VI compound semiconductor layer, and the third II–VI compound semiconductor layer is provided between the first II–VI compound semiconductor layer and the second II–VI compound semiconductor layer.

4. The semiconductor optical device according to claim 2, wherein a thickness of said metal electrode is equal to or larger than 10 nanometers and is equal to or less than 30 nanometers.

5. The semiconductor optical device according to claim 2, wherein a thickness of said first II–VI compound semiconductor layer is equal to or larger than 2 nanometers.

6. The semiconductor optical device according to claim 2, further comprising:

an active layer of a II–VI compound semiconductor provided on a supporting body, said supporting body including a ZnSe substrate, and said active layer being provided between said ZnSe substrate and said superlattice contact semiconductor region.

7. The semiconductor optical device according to claim 1, wherein a thickness of said metal electrode is equal to or larger than 10 nanometers and is equal to or less than 30 nanometers.

8. The semiconductor optical device according to claim 1, wherein a thickness of said first II–VI compound semiconductor layer is equal to or larger than 2 nanometers.

9. The semiconductor optical device according to claim 1, further comprising:

an active layer of a II–VI compound semiconductor provided on a supporting body, said supporting body including a ZnSe substrate, and said active layer being provided between said ZnSe substrate and said superlattice contact semiconductor region.

10. The semiconductor optical device according to claim 2, wherein a thickness of said metal electrode is equal to or larger than 10 nanometers and is equal to or less than 30 nanometers.

11. The semiconductor optical device according to claim 2, wherein a thickness of said first II–VI compound semiconductor layer is equal to or larger than 2 nanometers.

12. The semiconductor optical device according to claim 2, further comprising:

an active layer of a II–VI compound semiconductor provided on a supporting body, said supporting body including a ZnSe substrate, and said active layer being provided between said ZnSe substrate and said superlattice contact semiconductor region.

13. The semiconductor optical device according to of claim 3, wherein a thickness of said metal electrode is equal to or larger than 10 nanometers and is equal to or less than 30 nanometers.

14. The semiconductor optical device according to claim 3, wherein a thickness of said first II–VI compound semiconductor layer is equal to or larger than 2 nanometers.

* * * * *